(12) United States Patent
Grutzeck et al.

(10) Patent No.: US 10,647,568 B2
(45) Date of Patent: May 12, 2020

(54) MICROMECHANICAL COMPONENT INCLUDING DIAPHRAGM, MANUFACTURING METHOD FOR SUCH A COMPONENT AND METHOD FOR OPERATING A PRESSURE SENSOR

(71) Applicant: Robert Bosch GmbH, Stuttgart (DE)

(72) Inventors: Helmut Grutzeck, Kusterdingen (DE); Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 16/325,644

(22) PCT Filed: Jul. 31, 2017

(86) PCT No.: PCT/EP2017/069264
§ 371 (c)(1),
(2) Date: Feb. 14, 2019

(87) PCT Pub. No.: WO2018/041497
PCT Pub. Date: Mar. 8, 2018

(65) Prior Publication Data
US 2019/0194015 A1   Jun. 27, 2019

(30) Foreign Application Priority Data

Aug. 29, 2016   (DE) .................. 10 2016 216 229

(51) Int. Cl.
*B81C 1/00* (2006.01)
*G01L 9/00* (2006.01)
*G01L 19/06* (2006.01)

(52) U.S. Cl.
CPC ........ *B81C 1/00158* (2013.01); *G01L 9/0042* (2013.01); *G01L 19/0609* (2013.01);
(Continued)

(58) Field of Classification Search
None
See application file for complete search history.

(56) References Cited

U.S. PATENT DOCUMENTS

| 9,709,451 B2* | 7/2017 | Kaelberer | ........... G01P 15/0802 |
| 2013/0234263 A1 | 9/2013 | Ikehashi | |
| 2015/0198493 A1* | 7/2015 | Kaelberer | ........... G01P 15/0802 73/718 |

FOREIGN PATENT DOCUMENTS

DE   102014200500 A1   7/2015

OTHER PUBLICATIONS

English translation of international search report (Year: 2019).*
International Search Report for PCT/EP2017/069264, dated Nov. 2, 2017.

* cited by examiner

*Primary Examiner* — J. E. Schoenholtz
(74) *Attorney, Agent, or Firm* — Norton Rose Fulbright US LLP; Gerard A. Messina

(57) ABSTRACT

A micromechanical component including a mounting including a spanned diaphragm, which is warpable via a pressure difference between a first diaphragm side and a second diaphragm side against a diaphragm counter force according to a diaphragm spring constant of the diaphragm, and at least one actuator electrode, which is connected to the diaphragm and adjustable against a spring force according to at least one spring constant of at least one spring with the aid of a warping of the diaphragm, an overall system spring constant being definable as the sum of a diaphragm spring constant of the diaphragm and the spring constant of the single spring, or an overall spring constant of all springs, via which the at least one actuator electrode is connected to the
(Continued)

mounting, and the spring constant of the single spring or of all springs being at least 5% of the overall system spring constant.

13 Claims, 4 Drawing Sheets

(52) U.S. Cl.
CPC ............... *B81B 2201/0257* (2013.01); *B81B 2201/0264* (2013.01); *B81B 2203/0127* (2013.01); *B81B 2203/0163* (2013.01); *B81B 2203/053* (2013.01)

MICROMECHANICAL COMPONENT INCLUDING DIAPHRAGM, MANUFACTURING METHOD FOR SUCH A COMPONENT AND METHOD FOR OPERATING A PRESSURE SENSOR

FIELD

The present invention relates to a micromechanical component, to a microphone and to a pressure sensor. The present invention also relates to a manufacturing method for a micromechanical component. The present invention moreover relates to a method for operating a pressure sensor.

BACKGROUND INFORMATION

German Patent Application No. DE 10 2014 200 500 A1 describes a micromechanical pressure sensor device and a manufacturing method for manufacturing the same. The micromechanical pressure sensor device includes a wafer having an opening structured by the wafer which is covered with the aid of a spanned diaphragm in such a way that the diaphragm is warpable with the aid of a pressure difference between a front side of the wafer and a rear side of the wafer. Moreover, at least one actuator electrode is connected to the diaphragm in such a way, and additionally via a spring unit to the wafer in such a way, that the at least one actuator electrode is deflectable against a spring force of the spring unit with the aid of a warping of the diaphragm. The spring unit has a relatively soft design and allows in particular deflections of the at least one actuator electrode perpendicular to the plane of the wafer.

SUMMARY

The present invention provides a micromechanical component, a microphone, a pressure sensor, a manufacturing method, a micromechanical component, and a method for operating a pressure sensor.

The present invention provides options for sensing a pressure difference between a first diaphragm side and a second diaphragm side of a diaphragm with the aid of a sensitive component (made up of the diaphragm, the at least one actuator electrode and the at least one spring), whose sensitivity is determined less by a stiffness of the respective diaphragm, and more by a spring stiffness of the at least one spring via which the at least one actuator electrode is connected to the mounting. The at least one actuator electrode is mainly held with the aid of the at least one spring so that the spring constant of the single spring or an overall spring constant of all springs determines a pressure-induced deformation of the diaphragm and a pressure-induced deflection of the at least one actuator electrode. This is advantageous since the at least one spring is implementable with less strain than the diaphragm (which is designed for pressure limitation and therefore clamped on its entire circumference). Moreover, the at least one spring via which the at least one actuator electrode is connected to the mounting may be formed in a different plane than the diaphragm, and thus also with a spring constant which is adhered to more precisely. The sensitivity of the sensitive component (made up of the diaphragm, the at least one actuator electrode and the at least one spring) may thus be established to a desired value more precisely and more reliably. The present invention thus contributes to increasing a sensitivity and to improving an accuracy in the detection of pressure differences and/or measurement of pressure differences.

Moreover, the diaphragm may have a very soft design, i.e., have a low stiffness, with a use of the present invention. Accordingly, the diaphragm may also be comparatively thin. Process variations in the formation of the diaphragm have hardly any impact on its later use since an overall stiffness of the sensitive component (made up of the diaphragm, the at least one actuator electrode and the at least one spring) is defined, mainly, by the at least one spring constant of the at least one spring. A thin design of the diaphragm also allows a relatively small-surface-area design of the diaphragm, whereby the micromechanical component according to the present invention is minimizable more easily. The minimization of the micromechanical component according to the present invention achievable with the aid of the present invention also facilitates its attachability to at least one object to be examined, and additionally enhances its usability for different usage purposes.

It is also pointed out that the present invention contributes to the implementation of micromechanical components, microphones and pressure sensors which each require only a single diaphragm. Moreover, the use of only the one diaphragm per micromechanical component, microphone or pressure sensor is more space-saving than a corresponding provision of multiple diaphragms. Additionally, when using a single diaphragm, it is more easily possible to connect the at least one actuator electrode to the single diaphragm in such a way that no risk of (undesirable) tilting of the at least one actuator electrode exists during a warping of the diaphragm.

The objects of the present invention also respond less sensitively to a deformation/bending of the mounting, as is described in greater detail hereafter.

In one advantageous specific embodiment of the micromechanical component, the spring constant of the single spring, or the overall spring constant of all springs, via which the at least one actuator electrode is connected to the mounting is at least 50% of the overall system spring constant. An overall stiffness of the sensitive component is thus established mainly by the spring constant of the single spring or the overall spring constant of all springs. Spring constants of springs are establishable relatively precisely and reliably using simple work steps. For this reason, the sensitivity of the sensitive component corresponding to the overall stiffness may also be reliably established to a desired value using simple methods. Process fluctuations, as they often occur during the formation of the diaphragm have hardly any influence on the sensitivity of the sensitive component.

Moreover, the at least one actuator electrode may be adjustable, with the aid of the warping of the diaphragm, out of its respective starting position along and/or in parallel to an axis perpendicularly intersecting the diaphragm, against the spring force according to the at least one spring constant of the at least one spring. This may contribute to increasing a detection accuracy in the detection of pressure differences and/or measurement of pressure differences.

The at least one spring, via which the at least one actuator electrode is connected to the mounting, is preferably at least one U-shaped spring and/or at least one meander-shaped spring. Such spring types may be structured out of at least one semiconductor layer using simple etching steps, at the same time the spring constant of the at least one structured-out spring being reliably establishable to a desired value with the aid of a length, a height, a width and/or the U shape and/or meander shape of the at least one spring.

In one preferred specific embodiment of the micromechanical component, the at least one actuator electrode is connected to the mounting via exactly four springs as the at least one spring. In particular, the exactly four springs may be designed mirror-symmetrically with respect to a first plane of symmetry and with respect to a second plane of symmetry oriented perpendicularly to the first plane of symmetry. Such a connection of the at least one actuator electrode to the mounting reduces the conventional risk of tilting of the at least one actuator electrode during a warping of the at least one spring.

As an alternative, the at least one actuator electrode may also be connected to the mounting via exactly three springs as the at least one spring. In this case, it is advantageous when the exactly three springs are designed rotation-symmetrically with respect to a 120° rotation. The conventional risk of tilting of the at least one actuator electrode during the warping of the diaphragm may also be reduced with the aid of such a connection of the at least one actuator electrode to the mounting.

The above-described advantages are also ensured in a microphone including a corresponding micromechanical component.

A pressure sensor including such a micromechanical component also has the above-described advantages.

In one preferred specific embodiment, the pressure sensor includes at least one stator electrode, which is situated on the mounting and/or with respect to the mounting in such a way that a relative movement of the at least one stator electrode with respect to the mounting is suppressed during a warping of the diaphragm. Preferably, the pressure sensor includes an evaluation unit which is designed to establish and output an initial value with respect to the pressure difference between the first diaphragm side and the second diaphragm side, taking at least one signal with respect to at least one capacitance present between the at least one actuator electrode and the at least one stator electrode into consideration, and taking the at least one spring constant of the at least one spring into consideration. By taking the at least one spring constant of the at least one spring via which the at least one actuator electrode is connected to the mounting into consideration in the establishment of the initial value, it is considered that the overall stiffness of the sensitive component is determined, mainly, by the at least one spring constant of the at least one spring.

The above-described advantages are also achievable by carrying out a corresponding manufacturing method for a micromechanical component. It is pointed out that the manufacturing method is refinable according to the above-described specific embodiments of the micromechanical component.

Moreover, a corresponding method for operating a pressure sensor also yields the above-described advantages. The method for operating a pressure sensor may also be refined according to the specific embodiments of the above-described pressure sensor (or its micromechanical component).

BRIEF DESCRIPTION OF THE DRAWINGS

Further features and advantages of the present invention are described hereafter based on the figures.

DETAILED DESCRIPTION OF EXAMPLE EMBODIMENTS

Figure 1A:
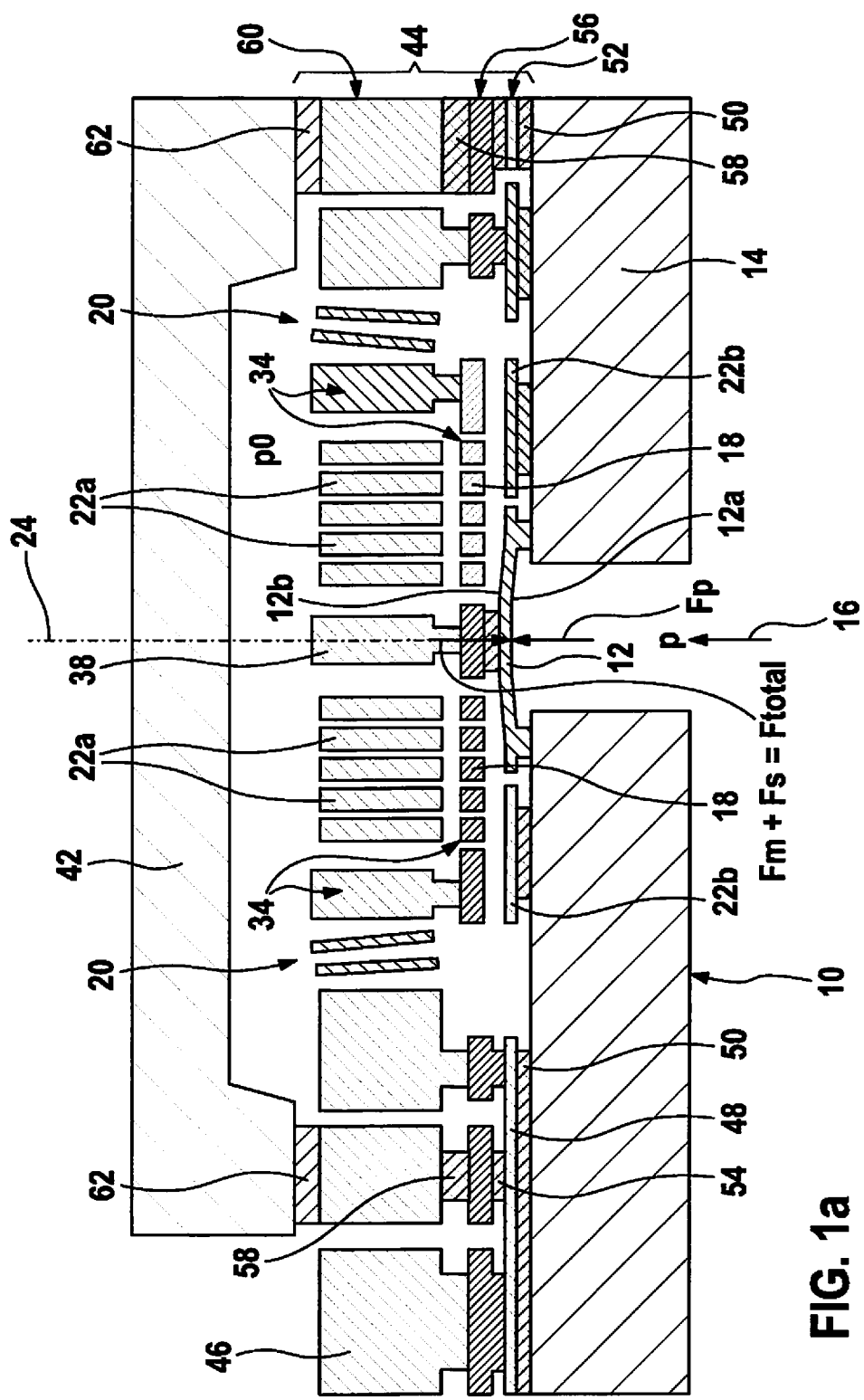
FIGS. 1a through 1c show schematic representations of one specific embodiment of the micromechanical component.
Figure 1B:
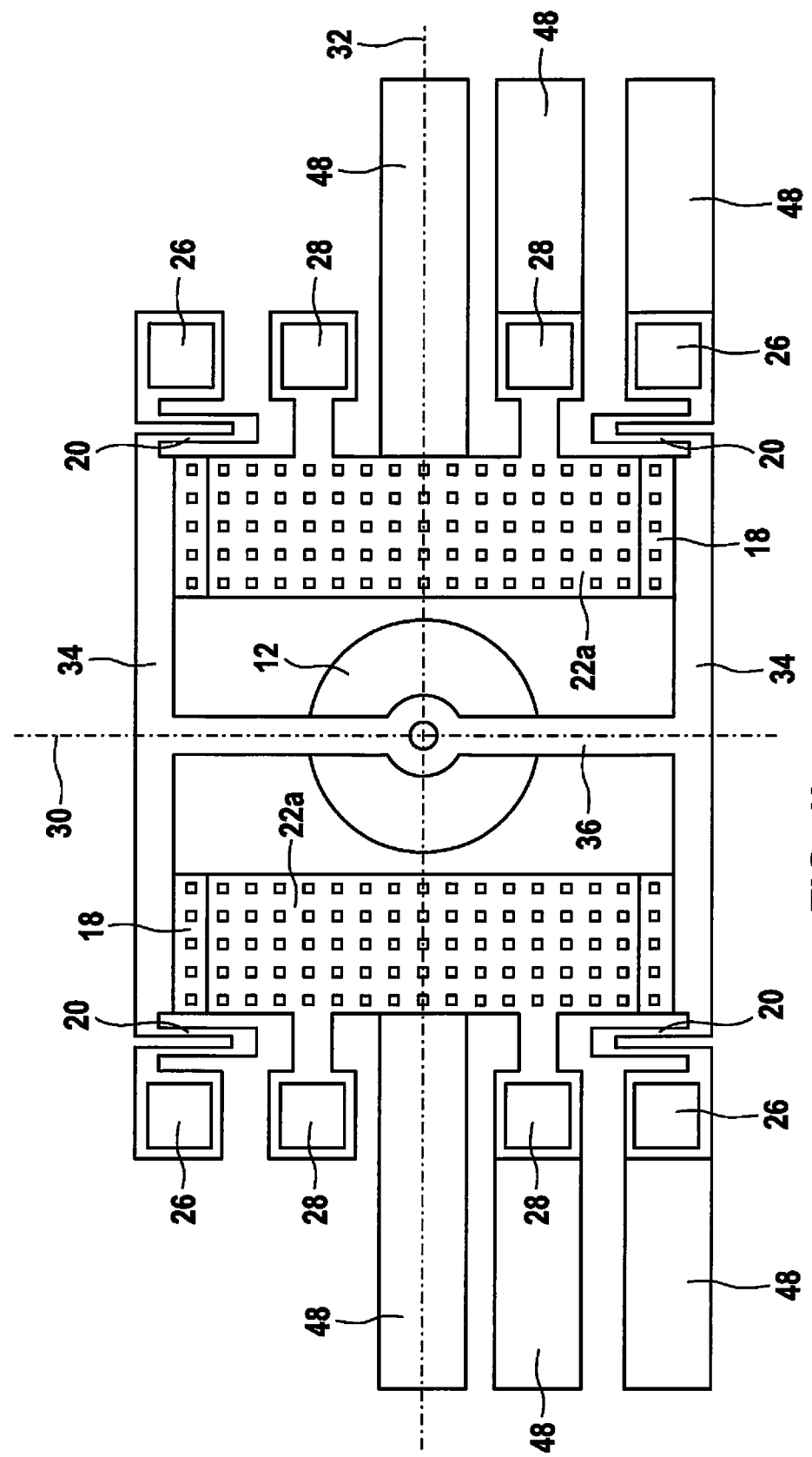
Figure 1C:
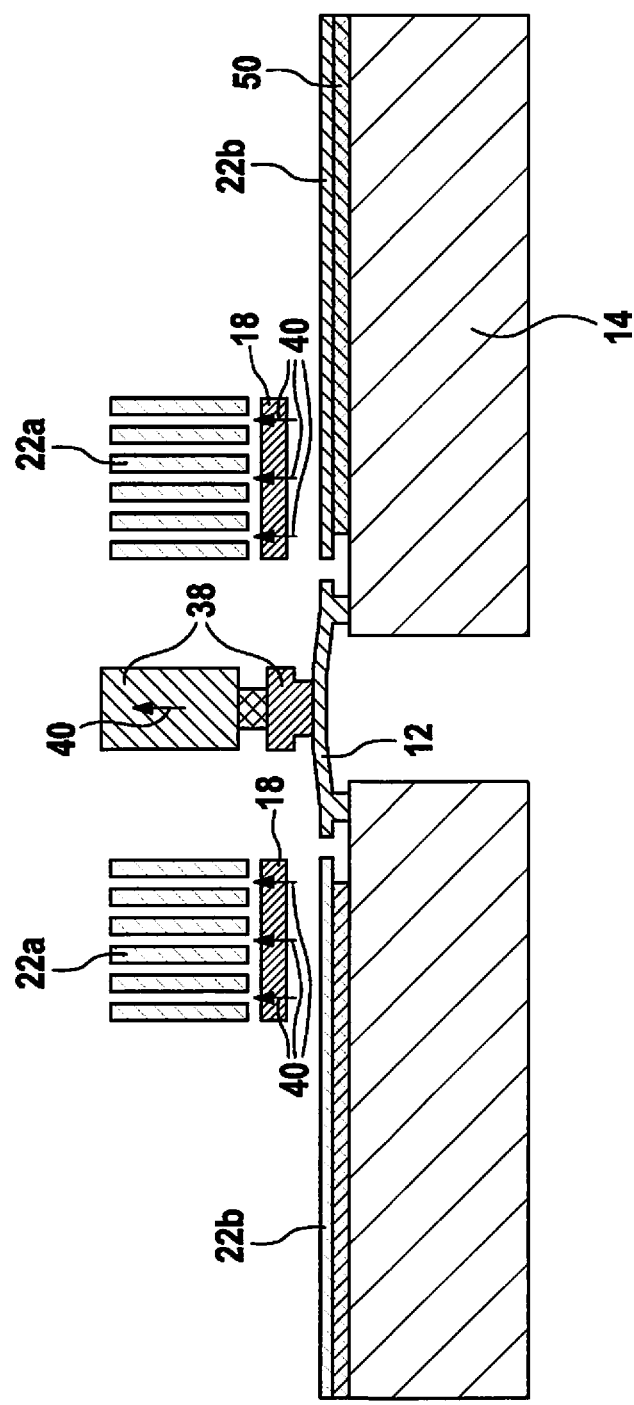

FIGS. 1a through 1c show schematic representations of one specific embodiment of the micromechanical component.

The micromechanical component schematically shown in FIGS. 1a through 1c includes a mounting 10 including a spanned diaphragm 12. By way of example, mounting 10 includes a semiconductor substrate/a semiconductor chip 14 (such as a silicon substrate/a silicon chip 14) including an opening 16 structured by the semiconductor substrate 14 which is covered/sealed in an air-tight manner with the aid of diaphragm 12. Diaphragm 12 may, for example, delimit an outer volume of mounting 10/of the micromechanical component having a pressure p present therein from an inner volume of mounting 10/of the micromechanical component having a reference pressure p0 present therein (e.g., near vacuum).

If a pressure is the same on a first diaphragm side 12a of diaphragm 12 and a second diaphragm side 12b of diaphragm 12 directed away from first diaphragm side 12a, e.g., when pressure p in the outer volume is equal to reference pressure p0 in the inner volume, diaphragm 12 is present in its initial shape. By contrast, diaphragm 12 is warpable out of its initial shape against a diaphragm counter force Fm according to a diaphragm spring constant of diaphragm 12 with the aid of a pressure difference between first diaphragm side 12a and second diaphragm side 12b, e.g., when pressure p in the outer volume deviates from reference pressure p0 in the inner volume. A warping of diaphragm 12 induced with the aid of the pressure difference may be understood to mean a concave warping of diaphragm 12 into the inner volume of mounting 10 and/or a convex warping of diaphragm 12 out of the inner volume of mounting 10.

The micromechanical component also includes at least one actuator electrode 18 which is connected to diaphragm 12 and, via at least one spring 20, is connected to mounting 10 in such a way that the at least one actuator electrode 18 is adjustable out of its respective starting position against a spring force Fs according to at least one spring constant of the at least one spring 20 with the aid of the warping of diaphragm 12. In this way, an overall system spring constant is definable as the sum of the diaphragm spring constant of diaphragm 12 and the spring constant of single spring 20 or an overall spring constant of all springs 20, via which the at least one actuator electrode 18 is connected to mounting 10. (The overall spring constant may be understood to mean a sum of the spring constants of all springs 20 via which the at least one actuator electrode 18 is connected to mounting 10). Moreover, the spring constant of single spring 20, or the overall spring constant of all springs 20, via which the at least one actuator electrode 18 is connected to mounting 10 is at least 5% of the overall system spring constant.

Diaphragm 12, the at least one actuator electrode 18 and the at least one spring 20 thus form a sensitive component (or pressure-sensitive component) of the micromechanical component, which is partially deformable and partially adjustable with the aid of the pressure difference between first diaphragm side 12a and second diaphragm side 12b. A partial deformation and a partial adjustment of the sensitive component (made up of diaphragm 12, the at least one actuator electrode 18 and the at least one spring 20) take place until an overall force Ftotal acting against the partial deformation and the partial adjustment is equal to a force Fp corresponding to the pressure difference. Overall force Ftotal corresponds to a sum of diaphragm counter force Fm and spring force Fs. However, since a ratio of spring force Fs to diaphragm counter force Fm is increased over the related art, overall force Ftotal is established/determined to a greater degree by spring force Fs. This may also be described in such a way that an overall stiffness of the sensitive component (made up of diaphragm 12, the at least one actuator electrode 18 and the at least one spring 20) is established to a greater degree by the spring constant of single spring 20 or the overall spring constant of all springs 20 of the sensitive component. (By contrast, the diaphragm spring constant of diaphragm 12 has less influence on the overall stiffness of the sensitive component.)

During a formation of diaphragm 12, process variances frequently occur, which make it more difficult to exactly establish a diaphragm stiffness/the diaphragm spring constant of diaphragm (and thus diaphragm counter force Fm). By comparison, the at least one spring constant of the at least one spring 20 may be established to a desired value with a comparatively high accuracy and a relatively low error rate with the aid of easily executable work steps. (The at least one spring 20 via which the at least one actuator electrode 18 is connected to mounting 10 may be at least one U-shaped spring 20 and/or at least one meander-shaped spring, for example.) The establishment of the overall stiffness of the sensitive component to a greater degree by the spring constant of single spring 20 or the overall spring constant of all springs 20 thus enables a more precise and more error-free establishment of the overall stiffness to a desired value. The sensitive component (made up of diaphragm 12, the at least one actuator electrode 18 and the at least one spring 20) may thus be used for more precisely and more reliably detecting/measuring a pressure difference between first diaphragm side 12a and second diaphragm side 12b.

In the micromechanical component described here, diaphragm 12 may have a relatively soft design (compared to diaphragms of standard sensor devices equipped with diaphragms). For this purpose, diaphragm 12 may be designed with a comparatively large diameter and/or a relatively low layer thickness.

Another advantage of the micromechanical component is its insensitivity to pressure exerted thereon from the outside (or a force exerted thereon from the outside). Since the overall stiffness of the sensitive component (made up of diaphragm 12, the at least one actuator electrode 18 and the at least one spring 20) is dependent to a large degree on the spring constant of the at least one spring 20, a deformation of mounting 10, even a bending of semiconductor substrate 14, has (almost) no impact on the overall stiffness of the sensitive component. This also facilitates a packaging of the micromechanical component, for example by soldering the micromechanical component onto a circuit board (not shown) and/or by insert molding the micromechanical component with a molding compound. Due to their thermal expansion coefficients, packaging materials (such as soldering compounds and molding compounds) may act with a significant pressure (or a significant force) from the outside on mounting 10, in particular on semiconductor substrate 14. A functionality/functional capability of the micromechanical component, however, is not/barely impaired by such an extraneous action (due to the establishment of the overall stiffness of the sensitive component mainly by the spring constant of single spring 20 or the overall spring constant of all springs 20).

The spring constant of single spring 20, or the overall spring constant of all springs 20, via which the at least one actuator electrode 18 is connected to mounting 10 is preferably at least 50% of the overall system spring constant. This improves an insensitivity of the sensitive component (made up of diaphragm 12, the at least one actuator electrode 18 and the at least one spring 20) with respect to process variations on diaphragm 12 and facilitates an establishment of a defined overall stiffness of the sensitive component which varies relatively little. In addition, this also improves a robustness of the sensitive component with respect to a deformation of the mounting, in particular with respect to a bending of semiconductor substrate 14.

In the specific embodiment described here, the micromechanical component includes at least one stator electrode 22a and 22b, which is situated on mounting 10 and/or with respect to mounting 10 in such a way that a relative movement of the at least one stator electrode 22a and 22b with respect to mounting 10 is suppressed during a warping of diaphragm 12. Advantageously, the at least one stator electrode 22a and 22b is situated on a side of the at least one actuator electrode 18 oriented toward diaphragm 12 and/or on a side of the at least one actuator electrode 18 directed away from diaphragm 12. Moreover, the at least one actuator electrode 18 is adjustable, with the aid of the warping of diaphragm 12, out of its respective starting position (against spring force Fs of the at least one spring 20) along and/or in parallel to an axis 24 perpendicularly intersecting diaphragm 12. The at least one actuator electrode 18 may thus be moved with the aid of the warping of diaphragm 12 (along and/or in parallel to axis 22) directly toward the at least one stator electrode 22a and 22b and/or (along and/or in parallel to axis 22) directly away from the at least one stator electrode 22a and 22b. With the aid of the warping of diaphragm 12, a significant capacitance change of at least one capacitance between the at least one actuator electrode 18 and the at least one assigned stator electrode 22a and 22b may thus be achieved. This may be utilized for the precise, reliable and error-free detection/measurement of a pressure difference between first diaphragm side 12a and second diaphragm side 12b, i.e., between pressure p and reference pressure p0.

The specific embodiment of FIGS. 1a through 1c includes at least one (free-standing) stator electrode 22a suspended above semiconductor substrate 14 on its side directed away from diaphragm 12 and at least one stator electrode 22b connected to semiconductor substrate 14 on its side oriented toward diaphragm 12 as the at least one stator electrode 22a and 22b. As an alternative, the at least one stator electrode 22b may also be designed as a free-standing electrode on the side of the at least one actuator electrode 22a oriented toward diaphragm 12. As is apparent in FIG. 1b, the at least one spring 20 may be anchored on mounting 10/semiconductor substrate 14 with the aid of at least one spring anchoring 26, whose position is situated identical or close to at least one position of at least one electrode anchoring 28, with the aid of which the at least one free-standing stator electrode 22a and 22b is anchored on mounting 10/semiconductor substrate 14. A deformation of the mounting, in particular a bending of semiconductor substrate 14, thus at the most triggers movements of electrodes 18, 22a and 22b, which are "adapted" to one another in such a way that the at least one capacitance between the at least one actuator electrode 18 and the at least one assigned stator electrode 22a and 22b does not change/hardly changes. In this way, an error signal will not/rarely have to be feared despite a deformation of the mounting, even with a bending of semiconductor substrate 14.

It is advantageous when the at least two springs 20 are at least partially, in particular completely, situated outside a volume spanned by electrodes 18 and 22a and 22b. The at least two springs 20 are preferably spaced apart from diaphragm 12 at a distance of at least 50% of a radius/minimum radius of diaphragm 12. Such an arrangement of the at least one spring 20 relatively far away from diaphragm 12 efficiently prevents a tilting of the at least one actuator electrode 18.

The micromechanical component preferably includes at least two springs 20, preferably at least four springs 20, via which the at least one actuator electrode 18 is connected to mounting 10. It is favorable when the at least two springs 20 are situated symmetrically around diaphragm 12. This also helps to prevent a tilting of the at least one actuator electrode 18.

Diaphragm 12 is preferably centrally situated. Diaphragm 12 may, in particular, be situated centrally between an even number of actuator electrodes 18, an even number of springs 20 and an even number of stator electrodes 22a and 22b. A first plane of symmetry 30, with respect to which diaphragm 12, actuator electrodes 18, stator electrodes 22a and 22b assigned thereto and the springs are mirror-symmetrically designed, may extend between the even number of actuator electrodes 18, the even number of springs 20 and the even number of stator electrodes 22a and 22b.

In the specific embodiment of FIGS. 1a through 1c, the at least one actuator electrode 18 is connected to mounting 10 via exactly four springs 20 as the at least one spring 20. By way of example, the micromechanical component includes two actuator electrodes 18 between which first plane of symmetry 30 extends. The exactly four springs 20 are also designed mirror-symmetrically with respect to a second plane of symmetry 32 oriented perpendicularly to first plane of symmetry 30. The number of exactly four springs 20 and their symmetry with respect to planes of symmetry 30 and 32 reduces the risk of a tilting of the at least one actuator electrode 18 during its deflection movement caused by the warping of diaphragm 12. The same advantage is ensured when the at least one actuator electrode 18 is connected via exactly three springs 20 to mounting 10, and the exactly three springs 20 are designed rotation-symmetrically with respect to a 120° rotation.

The micromechanical component shown schematically in FIGS. 1a through 1c may have a comparatively small and lightweight design due to the freedom from tilting of its at least one actuator electrode 18. Nevertheless, even a minimized design of the micromechanical component enables its reliable usability.

In the micromechanical component of FIGS. 1a through 1c, the at least one actuator electrode 18 is part of an actuator electrode frame 34, which is connected to diaphragm 12 via a first web element 36 (in first plane of symmetry 30) and via a second web element 38 (along axis 24). In FIG. 1c, arrows 40 reflect the adjustment movement of actuator electrode frame 34 triggered by the warping of diaphragm 12. By way of example, mounting 10 of the micromechanical component also includes a cap wafer 42, which is fixedly bonded to a frame 44 attached to semiconductor substrate 14. Moreover, the micromechanical component also includes a contact 46 which is formed outside cap wafer 42 and connected to at least one strip conductor 48 leading through frame 44. With respect to further properties of the micromechanical component, reference is made to the manufacturing method described hereafter.

The micromechanical component may advantageously be used in a microphone or in a pressure sensor. Such a pressure sensor preferably also includes an evaluation unit (not shown) which is designed to establish and output an output value with respect to the pressure difference between first diaphragm side 12a and second diaphragm side 12b, taking at least one signal with respect to at least one capacitance present between the at least one actuator electrode 18 and the at least one stator electrode 22a and 22b into consideration, and taking the at least one spring constant of the at least one spring 20 into consideration. The pressure sensor may also be designed as part of a sensor device with another sensor type, for example together with an acceleration, rotation rate and/or magnetic field sensor.

Figure 2:
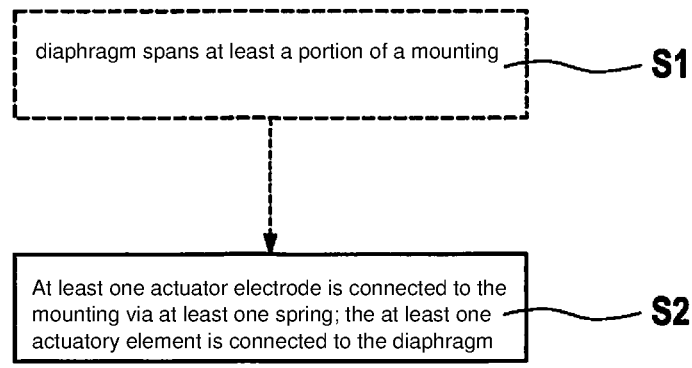
FIG. 2 shows a flow chart to explain one specific embodiment of the manufacturing method for a micromechanical component.

FIG. 2 shows a flow chart to explain one specific embodiment of the manufacturing method for a micromechanical component.

In an optional method step S1, a diaphragm spans at least a portion of a mounting in such a way that the diaphragm is present in its initial shape when a pressure is the same on a first diaphragm side of the diaphragm and a second diaphragm side of the diaphragm, and is warped out of its initial shape against a diaphragm counter force according to a diaphragm spring constant of the diaphragm with the aid of a pressure difference between the first diaphragm side and the second diaphragm side. As an alternative to carrying out method step S1, it is also possible to use an accordingly prefabricated diaphragm to carry out a method step S2.

In method step S2, at least one actuator electrode is connected to the mounting via at least one spring. Moreover, the at least one actuator electrode is connected to the diaphragm in such a way that the at least one actuator electrode is adjusted out of its respective starting position against a spring force according to at least one spring constant of the at least one spring with the aid of a warping of the diaphragm. An overall system spring constant is thus definable as the sum of the diaphragm spring constant of the diaphragm and the spring constant of the single spring, or an overall spring constant of all springs, via which the at least one actuator electrode is connected to the mounting. In addition, the spring constant of the single spring, or the overall spring constant of all springs, via which the at least one actuator electrode is connected to the mounting, is established at at least 5% of the overall system spring constant.

A layer composition, as comprehensively apparent in FIG. 1, may be used as starting material for carrying out method steps S1 and S2: Initially, a first insulating layer 50, such as a silicon dioxide layer, is formed on semiconductor substrate 14 (prior to or after the structuring of opening 16). Thereafter, a first semiconductor layer 52, in particular a thin polysilicon layer, is formed on first insulating layer 50. Diaphragm 12, stator electrodes 22b, the at least one strip conductor 48 and portions of frame 44 may (later) be structured out of first semiconductor layer 52. First semiconductor layer 52 is covered at least partially with a second insulating layer 54, such as a silicon dioxide layer. A second semiconductor layer 56, preferably an average polycrystalline silicon layer, is deposited on second insulating layer 54. Later, the at least one actuator electrode 18, portions of frame 44 and a portion of contact 46 are structured out of second semiconductor layer 56. A third insulating layer 58 (e.g., a silicon dioxide layer) covers second semiconductor layer 56 at least partially. Thereafter, a third semiconductor layer 60, preferably a thick epi polysilicon layer, is deposited on third insulating layer 58.

Springs 20, stator electrodes 22a, actuator electrode frame 34, web elements 36 and 38, portions of frame 44 and a portion of contact 46 are (later) structured out of third semiconductor layer 60.

After at least one etching process has been carried out for structuring the layer composition, cap wafer 42 may be hermetically bonded onto frame 44 via a bonded joint 62. Cap wafer 42 is used, on the one hand, as protection for the sensitive structures and, on the other hand, a defined pressure may be set as reference pressure p0 in the inner volume with the aid of the bonding process.

Figure 3:
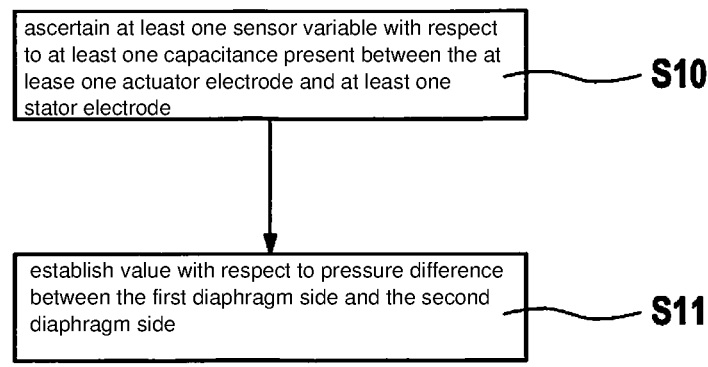
FIG. 3 shows a flow chart to explain one specific embodiment of the method for operating a pressure sensor.

FIG. 3 shows a flow chart to explain one specific embodiment of the method for operating a pressure sensor.

The micromechanical component of FIG. 1 may also be used to carry out the method explained here. However, it is pointed out that an ability to carry out the method requires only a pressure sensor including a mounting, a diaphragm spanned thereon, at least one actuator electrode, which is connected to the diaphragm and, via at least one spring, is connected to the mounting, and at least one stator electrode, an overall system spring constant being thus definable as the sum of a diaphragm spring constant of the diaphragm and a single spring constant or an overall spring constant of the at least one spring, and the single spring constant or the overall spring constant of the at least one spring being at least 5% of the overall system spring constant.

In a method step S10, at least one sensor variable with respect to at least one capacitance present between the at least one actuator electrode and the at least one stator electrode is ascertained. This takes place while the diaphragm, which is present in its initial shape when a pressure is the same on a first diaphragm side of the diaphragm and a second diaphragm side of the diaphragm, is warped out of its initial shape against a diaphragm counter force according to a diaphragm spring constant of the diaphragm with the aid of a pressure difference between the first diaphragm side and the second diaphragm side, and the at least one actuator electrode is adjusted out of its respective starting position against a spring force according to the at least one spring constant of the at least one spring with the aid of the warped diaphragm.

Thereafter, in a method step S11, a value with respect to the pressure difference between the first diaphragm side and the second diaphragm side is established. The establishment of the value takes place taking the at least one spring constant of the at least one spring and the at least one ascertained sensor variable into consideration.

What is claimed is:

1. A micromechanical component, comprising:
 a mounting including a spanned diaphragm, the diaphragm being present in its initial shape when a pressure is the same on a first diaphragm side of the diaphragm and a second diaphragm side of the diaphragm, and is warpable out of its initial shape against a diaphragm counter force according to a diaphragm spring constant of the diaphragm with the aid of a pressure difference between the first diaphragm side and the second diaphragm side; and
 at least one actuator electrode which is connected to the diaphragm, and, via at least one spring, is connected to the mounting in such a way that the at least one actuator electrode is adjustable out of its respective starting position against a spring force according to at least one spring constant of the at least one spring with the aid of a warping of the diaphragm;
 wherein an overall system spring constant is a sum of the diaphragm spring constant of the diaphragm and a total spring constant of all of the at least one springs via which the at least one actuator electrode is connected to mounting;
 wherein the total spring constant of all of the at least one springs via which the at least one actuator electrode is connected to the mounting, is at least 5% of the overall system spring constant.

2. The micromechanical component as recited in claim 1, wherein the total spring constant of all springs of the at least one springs via which the at least one actuator electrode is connected to the mounting is at least 50% of the overall system spring constant.

3. The micromechanical component as recited in claim 1, wherein the at least one actuator electrode is adjustable, with the aid of the warping of the diaphragm, out of its respective starting position along and/or in parallel to an axis perpendicularly intersecting the diaphragm, against the spring force according to the at least one spring constant of the at least one spring.

4. The micromechanical component as recited in claim 1, wherein the at least one spring, via which the at least one actuator electrode is connected to the mounting, is at least one U-shaped spring and/or at least one meander-shaped spring.

5. The micromechanical component as recited in claim 1, wherein the at least one actuator electrode is connected to the mounting via exactly four springs as the at least one spring.

6. The micromechanical component as recited in claim 5, wherein the exactly four springs are mirror-symmetrical with respect to a first plane of symmetry and with respect to a second plane of symmetry oriented perpendicularly to the first plane of symmetry.

7. The micromechanical component as recited in claim 1, wherein the at least one actuator electrode is connected to the mounting via exactly three springs as the at least one spring.

8. The micromechanical component as recited in claim 7, wherein the exactly three springs are rotation-symmetrical with respect to a 120° rotation.

9. A microphone, comprising:
 a micromechanical component including a mounting including a spanned diaphragm, the diaphragm being present in its initial shape when a pressure is the same on a first diaphragm side of the diaphragm and a second diaphragm side of the diaphragm, and is warpable out of its initial shape against a diaphragm counter force according to a diaphragm spring constant of the diaphragm with the aid of a pressure difference between the first diaphragm side and the second diaphragm side, and at least one actuator electrode which is connected to the diaphragm, and, via at least one spring, is connected to the mounting in such a way that the at least one actuator electrode is adjustable out of its respective starting position against a spring force according to at least one spring constant of the at least one spring with the aid of a warping of the diaphragm;
 wherein an overall system spring constant is a sum of the diaphragm spring constant of the diaphragm and a total spring constant of all of the at least one springs via which the at least one actuator electrode is connected to mounting;

wherein the total spring constant of all of the at least one springs via which the at least one actuator electrode is connected to the mounting, is at least 5% of the overall system spring constant.

10. A pressure sensor, comprising:
a micromechanical component including a mounting including a spanned diaphragm, the diaphragm being present in its initial shape when a pressure is the same on a first diaphragm side of the diaphragm and a second diaphragm side of the diaphragm, and is warpable out of its initial shape against a diaphragm counter force according to a diaphragm spring constant of the diaphragm with the aid of a pressure difference between the first diaphragm side and the second diaphragm side, and at least one actuator electrode which is connected to the diaphragm, and, via at least one spring, is connected to the mounting in such a way that the at least one actuator electrode is adjustable out of its respective starting position against a spring force according to at least one spring constant of the at least one spring with the aid of a warping of the diaphragm;
wherein an overall system spring constant is a sum of the diaphragm spring constant of the diaphragm and a total spring constant of all of the at least one springs via which the at least one actuator electrode is connected to mounting;
wherein the total spring constant of all of the at least one springs via which the at least one actuator electrode is connected to the mounting, is at least 5% of the overall system spring constant.

11. The pressure sensor as recited in claim 10, wherein the pressure sensor includes at least one stator electrode, which is situated on the mounting and/or with respect to the mounting in such a way that a relative movement of the at least one stator electrode with respect to the mounting is suppressed during a warping of the diaphragm, and the pressure sensor includes an evaluation unit, which is configured to establish and output an output value with respect to a pressure difference between the first diaphragm side and the second diaphragm side, taking at least one signal with respect to at least one capacitance present between the at least one actuator electrode and the at least one stator electrode into consideration, and taking the at least one spring constant of the at least one spring into consideration.

12. A manufacturing method for a micromechanical component, the method comprising:
connecting at least one actuator electrode via at least one spring to a mounting including a spanned diaphragm, the diaphragm being present in its initial shape when a pressure is the same on a first diaphragm side of the diaphragm and a second diaphragm side of the diaphragm, and is warped out of its initial shape against a diaphragm counter force according to a diaphragm spring constant of the diaphragm with the aid of a pressure difference between the first diaphragm side and the second diaphragm side, the at least one actuator electrode being connected to the diaphragm in such a way that the at least one actuator electrode is adjusted out of its respective starting position against a spring force according to at least one spring constant of the at least one spring with the aid of a warping of the diaphragm;
wherein an overall system spring constant being a sum of the diaphragm spring constant of diaphragm and a total spring constant of all of the at least one springs via which the at least one actuator electrode is connected to the mounting, and
wherein the total spring constant of all of the at least one springs via which the at least one actuator electrode is connected to the mounting is established at at least 5% of the overall system spring constant.

13. A method for operating a pressure sensor including a mounting, the mounting including a spanned diaphragm, at least one actuator electrode connected to the diaphragm, which via at least one spring is connected to the mounting, and at least one stator electrode, an overall system spring constant being a sum of a diaphragm spring constant of the diaphragm and a total spring constant of all of the at least one springs single spring constant or an overall spring constant of the at least one springs, and the total single spring constant of the at least one springs being at least 5% of the overall system spring constant, the method comprising:
ascertaining at least one sensor variable with respect to at least one capacitance present between the at least one actuator electrode and the at least one stator electrode, while the diaphragm, which is present in its initial shape when a pressure is the same on a first diaphragm side of the diaphragm and a second diaphragm side of the diaphragm, is warped out of its initial shape against the diaphragm counter force according to the diaphragm spring constant of the diaphragm with the aid of a pressure difference between the first diaphragm side and the second diaphragm side, and the at least one actuator electrode is adjusted out of its respective starting position against a spring force according to the at least one spring constant of the at least one spring with the aid of the warped diaphragm; and
establishing a value with respect to the pressure difference between the first diaphragm side and the second diaphragm side, taking the at least one spring constant of the at least one spring and the at least one ascertained sensor variable into consideration.

* * * * *